(12) United States Patent
Ottow et al.

(10) Patent No.: US 6,749,716 B2
(45) Date of Patent: Jun. 15, 2004

(54) APPARATUS FOR ASSESSING A SILICON DIOXIDE CONTENT

(75) Inventors: Stefan Ottow, Dresden (DE); Ulf Steuer, Dresden (DE)

(73) Assignee: Infineon Technologies AG, Munich (DE)

( * ) Notice: Subject to any disclaimer, the term of this patent is extended or adjusted under 35 U.S.C. 154(b) by 24 days.

(21) Appl. No.: 10/273,521

(22) Filed: Oct. 18, 2002

(65) Prior Publication Data

US 2003/0075272 A1 Apr. 24, 2003

(30) Foreign Application Priority Data

Oct. 18, 2001 (EP) .............................. 01124912

(51) Int. Cl.⁷ ............................ H01L 21/306

(52) U.S. Cl. .................... 156/345.15; 134/113; 422/83; 73/863

(58) Field of Search .......................... 422/83, 103, 904; 73/863, 864; 156/345.15, 345.18

(56) References Cited

U.S. PATENT DOCUMENTS

| 6,001,215 A | 12/1999 | Ban |
| 6,126,848 A | * 10/2000 | Li et al. ...................... 216/85 |
| 6,207,068 B1 | 3/2001 | Glick et al. |
| 6,286,526 B1 | 9/2001 | Hase et al. |

FOREIGN PATENT DOCUMENTS

JP  07 230 981  8/1995

* cited by examiner

*Primary Examiner*—Gregory Mills
*Assistant Examiner*—Sylvia R. MacArthur
(74) *Attorney, Agent, or Firm*—Laurence A. Greenberg; Werner H. Stemer; Ralph E. Locher

(57) ABSTRACT

An apparatus for assessing a silicon dioxide content of a phosphoric acid bath for etching silicon nitride and a system for etching silicon nitride bath utilize a sensor. In particular, the apparatus for assessing the silicon dioxide content of a phosphoric acid bath for etching silicon nitride of the present invention contains a sensor for measuring the $NH_3$ concentration of the phosphoric acid bath, a storage unit for storing data which define a relationship between the silicon dioxide content and the $NH_3$ concentration, and a device for calculating the silicon dioxide content of the basis of the measured $NH_3$ concentration and the stored data.

8 Claims, 2 Drawing Sheets

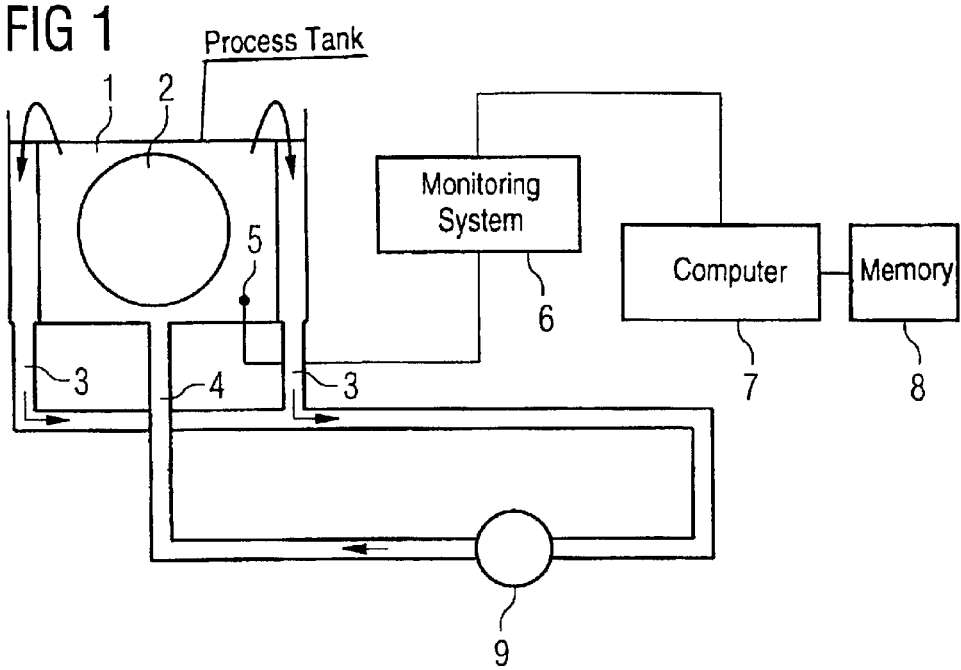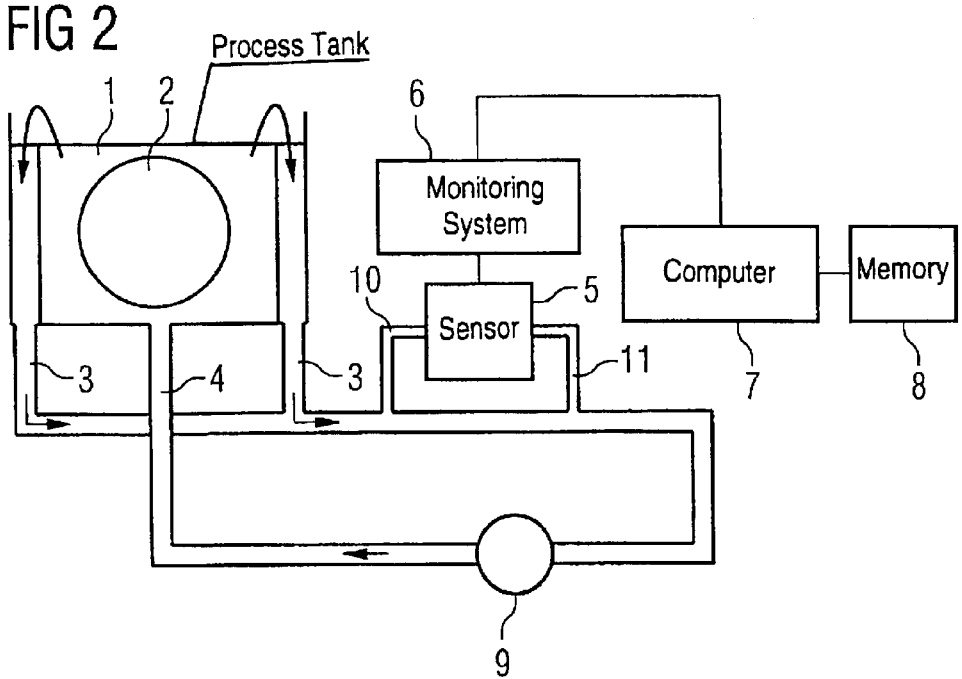

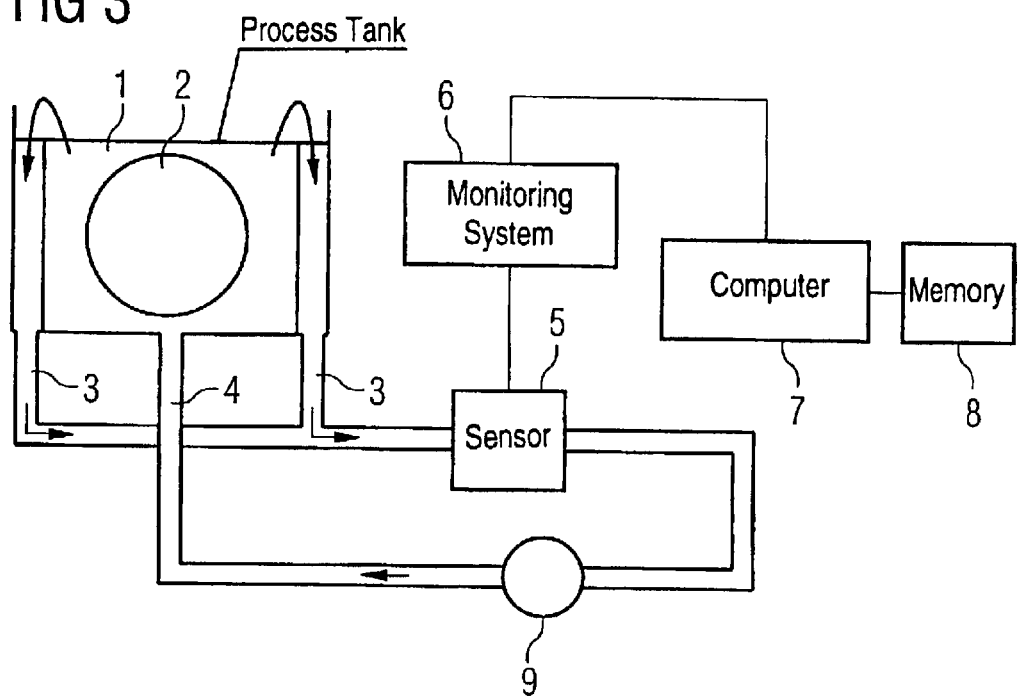

APPARATUS FOR ASSESSING A SILICON DIOXIDE CONTENT

BACKGROUND OF THE INVENTION

Field of the Invention

The present invention refers to an apparatus for assessing a silicon dioxide content of a phosphoric acid bath for etching a silicon nitride and to a system for etching silicon nitride.

Usually, in the manufacture of semiconductor integrated circuits, hot phosphoric acid baths are used for wet-etching of silicon nitride layers. Silicon nitride is generally used as a masking layer or as an insulator layer. When it becomes necessary to remove or to pattern the silicon nitride layer, normally, wet etching with hot phosphoric acid (HOT PHOS) is used. The chemical reaction that takes place is as follows:

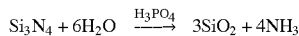

$$Si_3N_4 + 6H_2O \xrightarrow{H_3PO_4} 3SiO_2 + 4NH_3$$

Since the etching rate of silicon nitride ($Si_3N_4$) is more than ten times higher than the etching rate of silicon dioxide ($SiO_2$), silicon nitride is selectively etched. However, many factors influence the etching rate of both silicon nitride and silicon dioxide. They include: (i) a bath temperature which is held at a constant temperature (ii) a water content of the bath, which determines the overall etching rate of the bath, and, in particular, (iii) an $SiO_2$ content of the bath which strongly influences the selectivity.

Due to water evaporation and the reaction as indicated above, the concentrations of water as well as of silicon dioxide are continuously changing during the etching process. Therefore, for a well-controlled process, at least these two parameters should be controlled, too.

In particular, the $SiO_2$ content of a phosphoric acid etching bath should be in a certain range. More specifically, a minimum $SiO_2$ content is required in order to maintain the selectivity of the etching of $Si_3N_4$ with respect to $SiO_2$. On the other hand, there is only a limited amount of $SiO_2$, which can be dissolved in the etching solution. More concretely, the higher the $SiO_2$ content in the solution, the higher the expected amount of non-dissolved $SiO_2$. However, the particles could have a bad influence on the wafer surface or, even worse, could block filters of the etching equipment. Moreover, $SiO_2$ can even be existent as a colloid, which also negatively influences the characteristics of the etching bath.

However, it is difficult to measure the $SiO_2$ content of a phosphoric acid bath, especially with an in-situ method, which is necessary for the online control of the bath.

U.S. Pat. No. 6,207,068 discloses a silicon nitride etch bath containing a circulation line having a silicon dioxide condensing system formed of a heat exchanger and a secondary filter. More specifically, part of the phosphoric acid bath is cooled whereby the solubility of silicon dioxide is reduced and the precipitated silicon dioxide particles are extracted by the secondary filter. As a result, the overall silicon dioxide content of the phosphoric acid bath is reduced by a small amount. However, the system does not allow a measurement of the silicon dioxide content of the phosphoric acid bath. Accordingly, the silicon dioxide content is only reduced without any control thereof.

SUMMARY OF THE INVENTION

It is accordingly an object of the invention to provide an apparatus for assessing the silicon dioxide content of a phosphoric acid bath as well as a system for etching silicon nitride, which overcomes the above-mentioned disadvantages of the prior art devices of this general type.

With the foregoing and other objects in view there is provided, in accordance with the invention, an apparatus for assessing a silicon dioxide content of a phosphoric acid bath for etching silicon nitride. The apparatus contains a sensor for measuring a concentration of $NH_3$ in the phosphoric acid bath, a storage unit for storing data defining a relationship between a content of the silicon dioxide and the concentration of $NH_3$, and a device for calculating the content of the silicon dioxide on a basis of the concentration of $NH_3$ measured and the data stored in the storage unit. The device is connected to the storage unit and coupled to the sensor.

According to the present invention, the above object is achieved by an apparatus for assessing the content of silicon dioxide of a phosphoric acid bath for etching silicon nitride. The apparatus contains a sensor for measuring the concentration of $NH_3$ of the phosphoric acid bath, a recording unit for storing data that define a relationship between the content of silicon dioxide and concentration of $NH_3$, and a device for calculating the content of silicon dioxide on the basis of the measured concentration of $NH_3$ and the stored data.

Moreover, the present invention provides a system for etching silicon nitride and contains a process tank filled with a phosphoric acid bath, the apparatus for assessing the content of silicon dioxide of the phosphoric acid bath as defined above, and a monitoring system for monitoring the content of silicon dioxide.

As defined in the above equation, $NH_3$ is also a reaction product of the etching reaction. The influence of the $NH_3$ amount on the etching rate or selectivity has not yet been clarified so far. However, as the inventors of the present invention surprisingly found out, the concentration of $NH_3$ is directly related with the $SiO_2$ content of the solution. In particular, it has experimentally proven that both the $SiO_2$ and the $NH_3$ content increase proportional to the number of processed wafers, i.e. the amount of etched $Si_3N_4$.

As a consequence, it is possible to monitor the $SiO_2$ content by determining the $NH_3$ content of the solution. Since, in comparison to the detection of the silicon dioxide content, it is easier to assess the $NH_3$ content of a solution, for example by optical (in particular infrared) absorption measurement or titration, the $SiO_2$ content can easily be measured indirectly.

In particular, the apparatus for assessing the silicon dioxide content of the present invention contains a storage unit for storing data, which define a relationship between the content of silicon dioxide and concentration of $NH_3$. The data can be, for example, obtained from calibration measurements, which have to be conducted for each etching system in given time intervals.

The system for etching silicon nitride of the present invention contains a monitoring system for monitoring the content of silicon dioxide. The monitoring system is specifically adapted to decide whether the content of silicon dioxide of the bath is higher than a first predetermined value and lower than a second predetermined value.

In particular, if the content of silicon dioxide of the bath is higher than the second predetermined value, $SiO_2$ particles are likely to precipitate. Accordingly, the content of silicon dioxide of the bath must be lowered, for example by simply exchanging the phosphoric acid bath.

On the other hand, if the content of silicon dioxide of the bath is lower than the first predetermined value, the high etching selectivity between $Si_3N_4$ and $SiO_2$ is no longer given, and it is necessary to elevate the $SiO_2$ content of the bath. Since the $SiO_2$ content can easily be determined by the above mentioned method, the time at which the bath conditioning is to be finished can as well be easily determined.

Commonly used systems for etching silicon nitride also contain a circulation line for circulating part of the phosphoric acid bath. Accordingly, the sensor for assessing the $NH_3$ content can either be placed in the process tank or it can be placed in the circulation line. Alternatively, the sensor can be disposed in a bypass line connected to the circulation line.

The position of the sensor for assessing the $NH_3$ content can be chosen in dependence from the specific detection method used. As a suitable detection method any method as generally known in the art for assessing the $NH_3$ content of a liquid can be used. In particular, optical absorption using infrared light or titration can be used.

Accordingly, the present invention provides the now described advantages. The present invention provides an apparatus for measuring the $SiO_2$ content of a phosphoric acid bath used for etching silicon nitride layers. Thereby, the age of the phosphoric acid bath can exactly be determined. Since there are commercially available systems for measuring the $NH_3$ concentration, the apparatus of the present invention is very easy to handle and cheap to build. Accordingly, the silicon dioxide of the etching bath can be in-situ monitored whereby a high selectivity of the etching process is given and, at the same time, the precipitation of silicon dioxide particles is prevented. In particular, in the system for etching silicon nitride of the present invention, the monitoring system will preferably decide whether the silicon dioxide content is too low or too high. Based on this result, either the silicon dioxide content is to be raised, or it is to be lowered, for example by exchanging the etching bath. Accordingly, an online process control of the etching parameters is possible.

As a consequence, the phosphoric acid etching bath can more effectively be used without the danger of filter blocking and precipitation of silicon dioxide, whereby the cost will be largely reduced. In particular, by exactly determining the bath lifetime the consumption of phosphoric acid can be reduced.

Since the bath age can be determined exactly, the lifetime of the filters can be prolonged or the filters can even be removed completely. Accordingly, the cost can further be reduced.

Other features which are considered as characteristic for the invention are set forth in the appended claims.

Although the invention is illustrated and described herein as embodied in an apparatus for assessing a silicon dioxide content, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a block diagram of a first embodiment of a system for etching silicon nitride according to the invention;

FIG. 2 is a block diagram of a second embodiment of the system or etching silicon nitride according to the invention; and FIG. 3 is a block diagram of a third embodiment of the system according to the invention.

DESCRIPTION OF THE PREFERRED EMBODIMENTS

Referring now to the figures of the drawing in detail and first, particularly, to FIG. 1 thereof, there is shown main components of a system for etching silicon nitride according to a first embodiment of the present invention.

In FIG. 1, reference numeral 1 denotes a process tank which is filled with a hot aqueous ortho-phosphoric acid ($H_3PO_4$), and reference numeral 2 denotes a semiconductor wafer which is placed in the process tank 1, the semiconductor wafer 2 having a silicon nitride layer thereon which is to be etched. The process tank 1 is filled up to a typical volume of aqueous ortho-phosphoric acid. The hot aqueous ortho-phosphoric acid is heated and works at a small range of water content and temperature.

The process tank 1 has an outlet 3 for permanently draining part of the aqueous ortho-phosphoric acid and an inlet 4 for permanently feeding aqueous ortho-phosphoric acid. The outlet 3 and the inlet 4 form part of a circulation line in which the ortho-phosphoric acid is circulated by a pump 9. Usually, the circulation line is further provided with filters for filtering solid particles. However, since the etching system of the present invention avoids the precipitation of solid particles, the filters can be dispensed with, whereby further cost can be saved.

According to the first embodiment of the present invention, a sensor 5 for assessing the $NH_3$ content of the hot phosphoric acid is placed in the process tank 1. The $NH_3$ sensor 5 is adapted to measure the $NH_3$ content of the hot phosphoric acid continuously or at predetermined time intervals. In particular, the sensor 5 determines the $NH_3$ content on the basis of infrared absorption.

The measured $NH_3$ concentration is given to a computer 7, which calculates the silicon dioxide content on the basis of the measured $NH_3$ concentration and data, which are stored in the storage unit 8. The data define the relationship between silicon dioxide content and the $NH_3$ concentration and they can be obtained from calibration measurements, which have to be performed for each etching system at predetermined time intervals.

The calculated silicon dioxide content value is fed to the monitoring system 6, which decides whether the value is between a lower and an upper control limit. As explained above, a minimum silicon dioxide content is necessary in order to have a specific etching selectivity for etching silicon nitride with respect to silicon dioxide. On the other hand, the silicon dioxide content must not exceed a certain value so as to avoid precipitation thereof.

Accordingly, if the monitoring system 6 decides that the silicon dioxide content of the etching bath is higher than the preset maximum value, the silicon dioxide content has to be reduced. Usually, a bath exchange is performed. Otherwise, the etching bath is ready for production and it is used for etching silicon nitride.

On the other hand, especially after the etching bath has been replaced by a fresh hot phosphoric acid bath, if the silicon dioxide content is lower than the preset minimum value, a bath conditioning step is performed so as to raise the silicon dioxide content of the bath. As soon as the silicon dioxide content has reached the preset minimum value, the etching bath is ready for production, and in the course of the following etching processes the silicon dioxide content of the bath will be monitored in order to maintain it lower than the preset maximum value.

FIG. 2 shows the main components of a second embodiment of the system for etching silicon nitride, wherein the same reference numerals as in FIG. 1 denote the same components.

In the second embodiment, the $NH_3$ sensor 5 is disposed on a bypass line. More specifically, the etching system contains a sample inlet 10 and a sample outlet 11 that are connected to the circulation line, respectively. The inlet 10 and the outlet 11 feed and drain the $NH_3$ sensor, respectively. The $NH_3$ sensor is placed within the bypass. Part of the phosphoric acid in the circulation line flows into the $NH_3$ sensor 5 via the sample inlet 10, the $NH_3$ concentration thereof is assessed, and, thereafter, the analyzed part of the phosphoric acid is drained to the circulation line via the sample outlet 11.

In FIG. 3 a third embodiment of the invention is shown. The $NH_3$ sensor 5 is disposed directly within the outlet circuit. The sensor 5 is placed between the outlet 3 of the tank and the pump 9. Preferably, the sensor 5 is disposed close to the outlet 3. The full flow of liquid circulation through the circulation line passes the sensor 5.

In particular, if the $NH_3$ concentration is assessed by titration, it is possible to further provide inlet and outlet valves at the sample inlet and outlet, respectively. In this case, a predetermined sample volume can be taken from the circulation line from time to time, the $NH_3$ content can be assessed and, thereafter, the sample volume is again fed to the circulation line.

By the measures, it is possible to easily and exactly detect the silicon dioxide content of the hot phosphoric acid bath whereby the bath age can reliably be assessed and, as a consequence, the silicon dioxide content can be controlled to be in a predetermined range. As a consequence, optimum and reproducible process conditions will prevail during the etching process whereby a high quality will be maintained and the cost will be reduced.

We claim:

1. An apparatus for assessing a silicon dioxide content of a phosphoric acid bath for etching silicon nitride, comprising:

a sensor for measuring a concentration of $NH_3$ in the phosphoric acid bath;

a storage unit for storing data defining a relationship between a content of the silicon dioxide and the concentration of $NH_3$; and a device for calculating the content of the silicon dioxide on a basis of the concentration of $NH_3$ measured and the data stored in said storage unit, said device connected to said storage unit and coupled to said sensor.

2. A system for etching silicon nitride, comprising:

a process tank filled with a phosphoric acid bath;

an apparatus for assessing a content of silicon dioxide of the phosphoric acid bath, said apparatus containing:

a sensor for measuring a concentration of $NH_3$ in the phosphoric acid bath;

a storage unit for storing data defining a relationship between a content of the silicon dioxide and the concentration of $NH_3$; and a device for calculating the content of the silicon dioxide on a basis of the concentration of $NH_3$ measured and the data stored in said storage unit, said device connected to said storage unit and coupled to said sensor; and a monitoring system for monitoring the content of the silicon dioxide, said monitoring system connected to said sensor and said device.

3. The system for etching silicon nitride according to claim 2, wherein said sensor is disposed in said process tank.

4. The system for etching silicon nitride according to claim 2, further comprising a circulation line fluidically communicating with said process tank for circulating part of the phosphoric acid bath, said sensor disposed at a position so as to assess the concentration of $NH_3$ in said circulation line.

5. The system for etching silicon nitride according to claim 4, further comprising a bypass line fluidically communicating with and bypassing part of said circulation line, and said sensor disposed in said bypass line.

6. The system for etching silicon nitride according to claim 4, wherein said sensor is disposed within said circulation line.

7. The system for etching silicon nitride according to claim 2, wherein said monitoring system is adapted to decide that a step of increasing the content of the silicon dioxide of the phosphoric acid bath is to be performed if an assessed content of the silicon dioxide is lower than a predetermined value.

8. The system for etching silicon nitride according to claim 2, wherein said monitoring system is adapted to decide that a step of reducing the content of the silicon dioxide of the phosphoric acid bath is to be performed if an assessed content of the silicon dioxide is higher than a given predetermined value.

* * * * *